United States Patent [19]

Patz et al.

[11] Patent Number: 4,788,500

[45] Date of Patent: Nov. 29, 1988

[54] MEASUREMENT OF CAPILLARY FLOW USING NUCLEAR MAGNETIC RESONANCE

[75] Inventors: H. Samuel Patz, Wayland, Mass.; Robert C. Hawkes, Dry Drayton, England

[73] Assignee: Brigham & Women's Hospital, Boston, Mass.

[21] Appl. No.: 103,467

[22] Filed: Oct. 1, 1987

Related U.S. Application Data

[63] Continuation-in-part of Ser. No. 765,528, Aug. 14, 1985, abandoned.

[51] Int. Cl.$^4$ ............................................. G01R 33/20
[52] U.S. Cl. ..................................... 324/309; 128/653; 324/306
[58] Field of Search ................ 128/653; 324/306, 307, 324/309, 311, 312

[56] References Cited

U.S. PATENT DOCUMENTS

| | | | |
|---|---|---|---|
| 3,191,119 | 6/1965 | Singer | 324/306 |
| 3,419,793 | 12/1968 | Genthe et al. | 324/306 |
| 3,419,795 | 12/1968 | Genthe et al. | 324/306 |
| 3,473,108 | 10/1969 | McCormick | 324/306 |
| 3,551,794 | 12/1970 | Vander Heyden et al. | 324/306 |
| 3,562,632 | 2/1971 | Kirkland | 324/306 |
| 4,015,196 | 3/1977 | Moore et al. | 324/309 |
| 4,115,730 | 9/1978 | Mansfield | 324/309 |
| 4,165,479 | 8/1979 | Mansfield | 324/309 |
| 4,339,716 | 7/1982 | Young | 324/309 |
| 4,471,305 | 9/1984 | Crooks et al. | 324/309 |
| 4,516,582 | 5/1985 | Redington | 324/309 |
| 4,520,828 | 6/1985 | Burl et al. | 324/306 |
| 4,528,509 | 7/1985 | Radda et al. | 324/309 |
| 4,532,473 | 7/1985 | Wehrli | 324/306 |
| 4,532,474 | 7/1985 | Edelstein | 324/309 |
| 4,565,968 | 1/1986 | Macovski | 324/309 |
| 4,574,239 | 3/1986 | Singer | 324/306 |
| 4,574,240 | 3/1986 | Libove et al. | 324/306 |
| 4,595,879 | 6/1986 | Lent et al. | 324/309 |
| 4,602,641 | 7/1986 | Feinberg | 324/306 |
| 4,609,872 | 9/1986 | O'Donnell | 324/306 |
| 4,613,818 | 9/1986 | Battocletti et al. | 324/306 |
| 4,621,234 | 11/1986 | Caprihan | 324/306 |
| 4,629,987 | 12/1986 | King et al. | 324/306 |
| 4,639,671 | 1/1987 | Macovski | 324/309 |
| 4,665,366 | 5/1987 | Macovski | 324/307 |
| 4,685,468 | 8/1987 | Macovski | 324/309 |
| 4,707,658 | 11/1987 | Frahm et al. | 324/309 |

FOREIGN PATENT DOCUMENTS 1508438  4/1978  United Kingdom .

OTHER PUBLICATIONS

Singer and Grover, "Recent Measurements of Flow Using Nuclear Magnetic Resonance Techniques," Modern Developments in Flow Measurement, Clayton Ed., pp. 38–47 (1971).

Garroway, "Velocity Measurements in Flowing Fluids by MNR," Journal of Physics D: Applied Physics, vol. 7, pp. L159–L163 (1974).

List continued on next page.

Primary Examiner—Stewart J. Levy
Assistant Examiner—Kevin D. O'Shea
Attorney, Agent, or Firm—Saidman, Sterne, Kessler & Goldstein

[57] ABSTRACT

An improved method for measuring very slow flow rates using nuclear magnetic resonance techniques is disclosed. The basic technique is that of steady state free precession, in which a sequence of radio frequency pulses are applied to nuclei in a magnetic field having a substantial gradient, so that a driven equilibrium state is obtained and which is characterized by a spatial periodicity in the magnetization response of the nuclei. Two images are generated. The two images may be generated using different time intervals between the application of the radio frequency pulses. Alternatively, the two images may be generated using different effective gradients. The spatial periodicity, and the NMR response of flowing nuclei to the spatial periodicity, is thus different during the two image formations. One image is subtracted from the other, which cancels signals from static nuclei in the signal, while relatively fast flowing nuclei, namely in the larger blood vessels or the like, never reach the equilibrium state. The subtraction difference is therefore proportional only to nuclei which are part of relatively slowly flowing liquids, such as in capillary blood flow in organs.

42 Claims, 3 Drawing Sheets

OTHER PUBLICATIONS

Singer, "NMR Diffusion and Flow Measurements and an Introduction to Spin Phase Graphing," J. Phys. I. Sci. Instrumen., vol. 11, pp. 281-291 (1978).

Halbach et al., "Blood Flow Imaging Techniques Using NMR," IEEE 1982, Frontiers of Engineering in Health Care, pp. 1-4 (Sep. 20-21, 1982).

Singer and Crooks, "Nuclear Magnetic Resonance Blood Flow Measurements in The Human Brain," Science, vol. 221, pp. 654-656 (1983).

Singer and Crooks, "Using NMR to Measure Blood Flow Volume and Velocity," VD&T, Jan./Feb. 1984.

Taylor and Bushell, "The Spatial Mapping of Translational Diffusion Coefficients by the NMR Imaging Technique," Phys. Med. Biol., vol. 30, No. 4, pp. 345-349 (1985).

Hinshaw, "Image Formation by Nuclear Magnetic Resonance: The Sensitive Point Method," J. Appl. Phys., 47, 8, pp. 3709-3721 (1976).

Carr, "Steady State Free Precession in Nuclear Magnetic Resonance", Physical Review, vol. 112, No. 5, pp. 1693-1701.

Mansfield and Morris, "3.4 Steady State Free Precession", *NMR Imaging in Biomedicine,* Academic Press, 1982, pp. 65-77.

S. Matsui et al., "A New Method of Measuring $T_2$ Using Steady-State Free Precession", Jnl. Magnetic Resonance 62, 12-18 (1985).

MEASUREMENT OF CAPILLARY FLOW USING NUCLEAR MAGNETIC RESONANCE

CROSS-REFERENCE TO OTHER APPLICATIONS

This application is a continuation-in-part of U.S. patent application Ser. No. 765,528, filed Aug. 14, 1985, now abandoned.

This application has the same assignee and one of the same inventors as allowed U.S. patent application Ser. No. 896,814, filed Aug. 15, 1986, entitled CREATION AND USE OF A MOVING REFERENCE FRAME FOR NMR IMAGING OF FLOW, now U.S. Pat. No. 4,716,367.

FIELD OF THE INVENTION

This invention relates to improvements in nuclear magnetic resonance measurement techniques. More particularly, this invention relates to methods for using nuclear magnetic resonance techniques for determination and imaging of extremely low flow rates, such as blood flow in capillaries.

BACKGROUND OF THE INVENTION

The techniques of nuclear magnetic resonance are well known to the art. In general, nuclear magnetic resonance involves aligning the magnetic moments of atomic nuclei in a sample by exposing the sample to an external magnetic field. A pulse of radio frequency energy is then applied to the sample, to cause the moments of the nuclei to be aligned along a particular axis, typically 90° to the axis of the external magnetic field. Over time, the nuclei will return to alignment with the external field. As they do so, they emit electromagnetic radiation which can be detected. The rate at which the moments of the nuclei return to alignment with the external field is characteristic of the nuclei and the nuclear site. This fact is used in a variety of methods for generating images of the density of the nuclei, for example, in a "slice" of a human body or other sample in which they are located. In this way, a detailed cross-sectional view of the body is provided, in a non-invasive technique.

A number of different types of NMR-produced images are available, in which the intensity of each element of the image varies with a different parameter. Tissue type is perhaps the most usual. Images in which the intensity of each element varies with blood flow rate have also been provided, as discussed below.

One image which is not presently available on commercial NMR imagers used clinically is one in which the intensity of the elements of the image is proportional to flow at very low rates, specifically the rate of blood flow in capillaries of organs. This would be of great relevance in determination of the health of organs, and also to determine whether adequate blood is being supplied to them.

The use of nuclear magnetic resonance for measurement of flow of liquids is well known in the art, and several different techniques have been proposed. Moore et al., U.S. Pat. No. 4,015,196, suggests the application of a technique known as steady state free precession to the study of flow. The steady state free precession technique is defined generally at column 7, lines 15-57, of the Moore et al. patent and is related to flow among other uses at column 7, lines 58-61.

However, for a variety of reasons, the early SSFP techniques became unpopular in the art. One reason is that newly introduced spin-echo methods gave superior gray/white matter contrast in brain images. Another reason has to do with the recording of the NMR signal itself. In early SSFP techniques, the magnetization only rephased at the time radio frequency energy was being transmitted to the sample. Because the transmission of energy interferes with the reception of the very small NMR signal, some of the signal during the time of rephasing cannot be recorded. Recently, two and three dimensional Fourier techniques for SSFP have been developed and tissue contrast has improved (see, for example, Hawkes & Patz, "Rapid Fourier Imaging Using SSFP"), these more recently developed Fourier techniques allow for the complete data collection of the rephasing NMR signal.

The use of magnetic field gradients with NMR has long been recognized as introducing a flow sensitivity to the received signal. The applications of spin echo techniques to flow are discussed in a number of articles. See "Nuclear Magnetic Resonance Blood Flow Measurements in the Human Brain" by Singer and Crooks, *Science*, Vol. 221, pp. 654-656 (1983); "NMR Diffusion and Flow Measurements: An Introduction to Spin Phase Graphing" by Singer, *J. Phys. B: Scientific Instruments*, Vol. 11, pp. 281-291 (1978); "The Spatial Mapping of Translationship Diffusion Coefficients by the NMR Imaging Technique." Taylor and Bushell, *Phys. Med. Biol.*, Vol. 30, No. 4, pp. 345-349 (1985); *Modern Developments in Flow Measurement*, Chapter 2-1: "Recent Measurements of Flow Using Nuclear Magnetic Resonance Techniques" by Singer and Grover, pp. 38-47 (1971); "Using NMR to Measure Blood Flow Volume and Velocity" by Singer and Crooks, Barrington Publications, Inc.; and U.S. Pat. No. 4,520,828 to Burl et al. All of these references, as well as the Moore et al. patent, are incorporated by reference herein.

An example of a known flow measurement technique, such as that employed by Singer and Crooks, may be described generally as follows. An initial magnetic field $H_0$ is supplied to cause all the nuclear spins to line up. The spins are then tipped away from the $H_o$ direction by the application of an RF pulse, using what is referred to as a 90° pulse, to indicate that the spins are rotated 90° with respect to the applied magnetic field $H_0$. A magnetic field having a gradient (that is, the magnetic field varies in the plane of the "slice" which is to be measured) is applied, which then causes the in-phase spins to dephase as a function of time. After a specific time $\tau$, a second ratio frequency pulse is applied, which again tips the spins in the slice. Nuclei of, for example, blood, which have flowed into the slice of the body during the period $\tau$ are tipped by application of the second radio frequency pulse, as are any which had become realigned with the external field $H_0$ in the interval. Ordinarily, the interval $\tau$ will be much less than the typical relaxation time $T_1$, such that the contribution of the latter effect is small. Accordingly, the signal detected after the application of the second pulse contains a component proportionate to blood flow, as well as a smaller component proportional to the amount of nuclei which relaxed during the time $\tau$.

A number of different measurements using gradually increased times $\tau$ are performed. At some point, a maximum signal value will be reached, indicating that all the blood in the slice has been replaced during the period $\tau$.

It will be appreciated by those skilled in the art that for each value of $\tau$, the experiment just described provides the data for a single projection of the imaged slice. A number of different projections are made for each value of $\tau$ in order to make an image of the material which flowed into the slice in the time $\tau$. The actual number of projections made determine the resolution of the image.

As is well known, the nuclei precess about the external field at a frequency referred to as the Larmor frequency, which is proportional to the magnetic field at their location. The signal emitted is a function of the precession frequency. Since a gradient has been imposed upon the external field, the Larmor frequencies of nuclei at different positions within the slice vary. Accordingly, the Fourier transform, providing as it does a frequency distribution of the nuclei, simultaneously provides a spatial distribution or projection of the nuclear density within the matrix. Hence, the Fourier-transformed data can be used to directly form an image. This imaging technique, of course, is well known to the prior art, and is described here as an example of an imaging technique. It is referred to here only to provide a basis for the subsequent discussion.

The Singer and Crooks technique just described requires knowledge of vein volume in order to generate an actual flow rate value. This requires that the vein or artery through which flow is to be measured be large enough that it can actually be measured on the image, and a value for volume thus calculated. In practice, this means that the vein must be at least 2 or 3 millimeters in diameter. Capillary flow is therefore not measurable using this technique, because capillaries (having diameters less than 5 microns) are too small to show up individually on the image. Furthermore, the technique impliedly assumes that the flow is essentially perpendicular to the plane of the slice. Capillary flow may be thought of as a convoluted flow, and cannot be assumed to be in any given direction at any given time, such that this assumption will not hold true. Furthermore, the best result reported by Singer and Crooks is measurement of flow at a rate of about 2 centimeters per second; typical rates of capillary flow are lower by a factor of about 20. For all these reasons, the Singer and Crooks technique is not applicable to very low flow rates in very small vessels, such as capillary flow.

OBJECTS OF THE INVENTION

It is accordingly an object of the invention to provide an NMR flow rate measurement technique which provides reasonably accurate values for the rate of flow in extremely small conduits, such as blood flow in capillaries.

It is a further object of the invention to provide a method for measuring flow rates using nuclear magnetic resonance techniques in which a steady state free precession, driven equilibrium state is maintained, whereby contributions to the spin-relaxation signal from static matter and relatively fast flowing matter is disregarded, due to the specific technique employed, and wherein only very slow flow contributes to the signal, such that accurate imaging of low flow rates can be provided.

It is a further object of the invention to provide a nuclear magnetic resonance technique for physical imaging using steady state free precession techniques, in which the radio frequency pulses used to drive the system into a driven equilibrium state are prevented from substantial interference with reception of the received signal, such that the full information content is retrieved from the relaxation signal.

It is a further object of the invention to provide an NMR imaging system in which the relative intensity of elements in the image relates to the relative rate of capillary blood flow, whereby variations in flow rate in tissues can be observed, so as to enable evaluation of the relative health of the tissues as measured by the blood supply thereto.

Other aspects and objects of the invention will be apparent to those of skill in the art.

SUMMARY OF THE INVENTION

The present invention achieves the needs of the art and objects of the invention mentioned above by its provision of an improved NMR technique in which two images are generated using steady state free precession techniques. Subtraction of one image from the other provides an image in which the intensity of each image element is proportional only to the density of nuclei flowing slowly therethrough. An image of capillary flow rates is thus provided.

The steady state free precession technique, as is understood in the prior art, involves application of repetitive pulses of RF energy to a sample which is in a magnetic field with an applied gradient, such that the nuclear magnetization which is established in this "driven-equilibrium" state has a spatial periodicity along the direction of the magnetic field gradient. The spatial periodicity varies with both the amplitude and duration of the applied gradient as well as with the interpulse time $\tau$. We define the term $\lambda$ to be the distance over which the magnetization is periodic. $\lambda$ is the spatial wavelength.

According to one implementation the invention, two images are produced, each with different interpulse spacings $\tau_1$ and $\tau_2$ in time between the RF pulses, such that the spatial periodicity of the data used to generate the images differs. Alternatively, the spatial periodicity may be altered by changing an effective gradient. (An "effective gradient" is the magnitude of an hypothetical constant gradient which, if applied, would have the same phasing or dephasing effect on the spins of stationary nuclei as does a non-constant gradient which is actually applied.) After the Fourier transform process is applied to transform the data from time-based samples to frequency-based samples, the images are directly subtracted from one another. When subtraction is performed, fixed components (i.e., due to non-moving nuclei in the tissues) disappear from the signal, having a portion of the signal which is proportional only to flow.

By careful selection of the spatial periodicity by control of the interpulse interval and/or effective gradient, nuclei flowing at relatively high flow rates, such as blood in veins, arteries and the like, do not appear in the signal because they do not remain in a particular location long enough to establish a driven equilibrium state. The result is that only slow flow rate nuclei in capillaries and the like, which move a distance much less than the spatial wavelength in the interpulse period, contribute to the signal. The difference between the two images is thus proportional to the flow within certain velocity limits. These limits can easily be made to encompass the range of capillary flow.

BRIEF DESCRIPTION OF THE DRAWINGS

The invention will be better understood if reference is made to the accompanying drawings in which:

FIG. 4(a), showing the amplitude of the radio frequency pulses as a function of time;

FIG. 4(b), showing the relaxation signal as a function of time;

FIG. 4(c), showing the gradient which is applied as a function of time; and

FIG. 4(d), showing the detected signals as a function of time;

FIG. 5(a), showing the sequence of radio frequency pulses applied;

FIG. 5(b), showing the read gradient applied;

FIG. 5(c), showing the detected signal; and

FIG. 5(d) shows the phase encoding gradient; and

DETAILED DESCRIPTION OF THE PREFERRED EMBODIMENTS

As discussed briefly above, the basic techniques of NMR imaging are well known to the art. Therefore, when a particular technique or method is not described in detail herein, it is to be understood that it is generally within the prior art; reference is made generally thereto and specifically to the publications incorporated by reference above, for more detailed discussions of such matters. The disclosure herein is meant to support the claims hereof, and not to provide an exhaustive review of NMR techniques generally.

Figure 1:
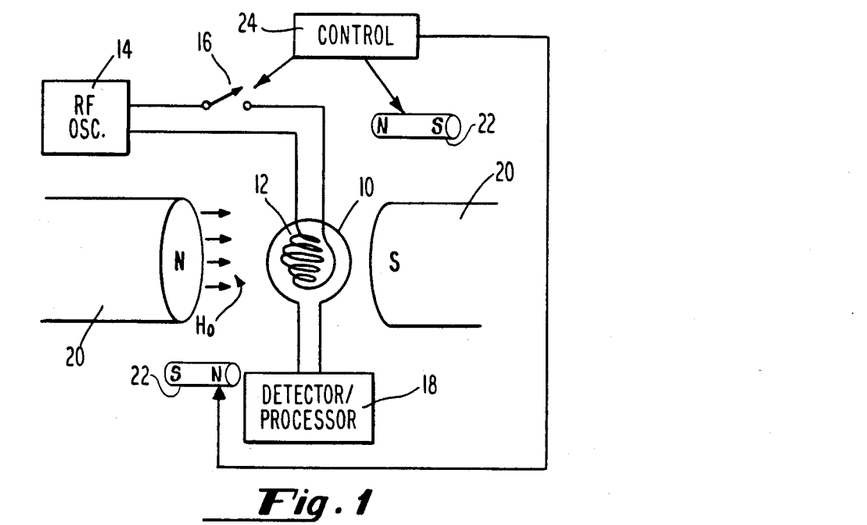
FIG. 1 shows schematically the experimental apparatus.

Referring now to FIG. 1, a schematic view of experimental apparatus for performing NMR imaging is shown. A sample is confined within a pair of coils 10 and 12. Coil 12 is connected to radio frequency oscillator 14 by a switch 16 controlled by control device 24, so that when switch 16 is closed, a pulse of radio frequency energy is applied to the sample therewithin. Coil 10 is connected to detector and processing devices indicated generally at 18, which may be all as disclosed in the prior art, as is control device 24. See, for example, the Singer review article referred to above.

The sample and the two coils 10 and 12 (which may be the same) are all confined within a large-valued magnetic field $H_0$ shown schematically as being provided by the two poles of a large magnet 20. An additional field is provided by additional magnets 22. These are controlled by control device 24 to provide a magnetic field having a linear gradient G which may be controlled individually in the X, Y and Z directions. All this is well understood by the prior art. In particular, the gradient G of the field is provided by additional magnets shown schematically at 22, which are programmable to vary the gradient through the number of different gradients needed to complete the image. In a typical imaging technique, 256 different combinations of gradients in the X and Y directions are provided, such that a total image of approximately 64,000 pixels can be separately generated. (The conventional notation for vector fields $H_0$ and G with arrows above the letters is not used herein for reasons of convenience, and should be understood.)

As is generally the rule in NMR processing, the external field $H_0$ causes nuclei in the sample to take a given angle with respect to the direction of the lines of the field $H_0$, and to process there around at the Larmor frequency. When a subsequent pulse of radio frequency energy is applied, the nuclei are caused to take a new alignment with respect to this external field, and then continue to precess at the Larmor frequency. As is well known, this precession frequency is a function of the applied magnetic field and of the gyromagnetic ratio of the nucleus, which in turn is a function of the species of the nucleus.

After the radio frequency pulse ceases, the nuclei return one by one to alignment with the field $H_0$ over a period of time. The "relaxation time" $T_1$, within which a particular fraction (63%) of the nuclei return to alignment with $H_0$, is a characteristic of the material and is used in conventional imaging techniques to identify the material. The relaxation of the nuclear magnetic moments perpendicular to $H_0$ is characterized by a different relaxation time $T_2$. The relaxation times $T_1$ and $T_2$, as well as the density of protons in a particular tissue, are the parameters which determine the observed signal intensity in conventional NMR imaging methods.

Figure 2:
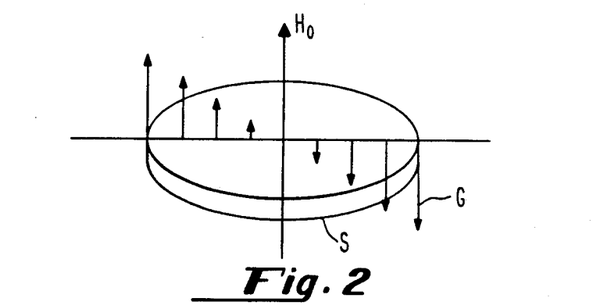
FIG. 2 shows the relative orientation of the external magnetic field $H_0$ and of the gradient G through a slice of tissue S to be imaged.

FIG. 2 shows the gradient G of the magnetic field through a slice of a sample to be measured, e.g. a section through the torso of a patient. The slice is not necessarily perpendicular to the external field $H_0$. As shown, the variation in the magnetic field, of which the gradient G is the measure, is quite substantial across the slice S. This is done purposely, such that the Larmor frequency of nuclei in the sample varies quite widely across the extent of the slice S. Such variation is necessary to provide images using the SSFP techniques according to the invention (and for other imaging techniques generally).

Throughout the following discussion, the contribution made by the magnetic field $H_0$ to the precession of the nuclear spins will be ignored, as is conventional in the art, and the discussion will be from the point of view of the rotating reference frame, that is, that of a reference frame that is stationary with respect to the precession due to the field $H_0$, again as is entirely conventional in the art. As also conventional in the art, terminology such as "a 90° pulse" will be used to refer to a radio frequency pulse supplied by energization of the coil 12 for a length of time sufficient to cause a number of nuclei to be polarized about axes 90° to the magnetic field $H_0$.

Figure 3:
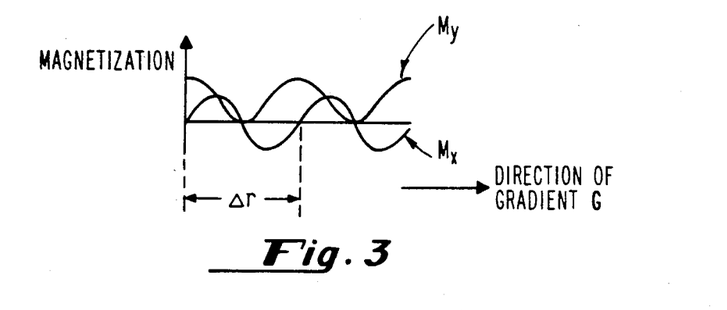
FIG. 3 shows the relative magnetization of nuclear spins in the direction of the effective gradient, and defines the spatial periodicity thereof.

FIG. 3 shows schematically what occurs when the radio frequency oscillator 14 and switch 16, under control of control device 24, are operated to provide a regular sequence of pulses of radio frequency energy in the slice S, disposed in a relatively strong gradient field. (As a matter of interest to those of skill in the art, the gradients required by the present invention are those typically available in clinical NMR machinery, that is, less than about 1.0 Gauss/cm. In the preferred embodiment, a maximum gradient of only 0.25 Gauss/cm is employed to produce high-quality images. The high gradients presently found primarily in laboratory equipment, as used for example in diffusion studies, are not required by the techniques of the invention.) Regular, extremely short 90° pulses are applied at intervals τ. Application of a brief radio frequency pulse of energy will result in the radio frequency energy being of relatively wide bandwidth; as is well understood, the shorter the pulses the wider their bandwidth must necessarily be. Accordingly, the RF energy will be at the Larmor frequencies of a wide variety of nuclei. Therefore, nuclei substantially throughout the sample will be excited. (The terms "protons", "spins" and "nuclei" are used substantially interchangeably throughout this portion of this specification as the nuclei involved in practical techniques are generally hydrogen nuclei, which are simply protons which possess angular momentum or "spin").

In the presence of an applied gradient with a nonzero value of its effective gradient strength, $G_{eff}$, the application of a periodic sequence of RF pulses will cause the establishment of a periodic nuclear magnetization along the direction of $G_{eff}$ and with a spatial periodicity λ as shown in FIG. 3. This is referred to as the driven equilibrium state. Experimental results indicate that the driven equilibrium state is established after application of a number of RF pulses; stabilization is deemed to occur after a time on the order of $T_1$.

FIG. 3 shows this schematically. The nuclear spins are caused to enter a state of driven equilibrium in both X and Y directions by application of a radio frequency pulse at an interval τ. The magnetization (which is proportional to the alignment of the spins) in X and Y, $M_x$ and $M_y$, respectively, is shown. The signals shown are the response measured with respect to a periodic sequence of +90° and −90° RF pulses in the X direction of the rotating reference frame. The magnetization of the nuclei in the driven equilibrium state has a spatial periodicity or wavelength λ defined by the relation:

$$\lambda = \frac{1}{G_{eff} * \gamma * \tau} \quad (1)$$

In this relation, $G_{eff}$ is the effective gradient, λ is the gyromagnetic ratio of the nucleus (42.576 MHz/Telsa for hydrogen nuclei), and * is ordinary multiplication. Because the effective gradient $G_{eff}$ and the time constant τ are independently controllable, the wavelength λ can be adjusted according to the invention.

Figure 4:
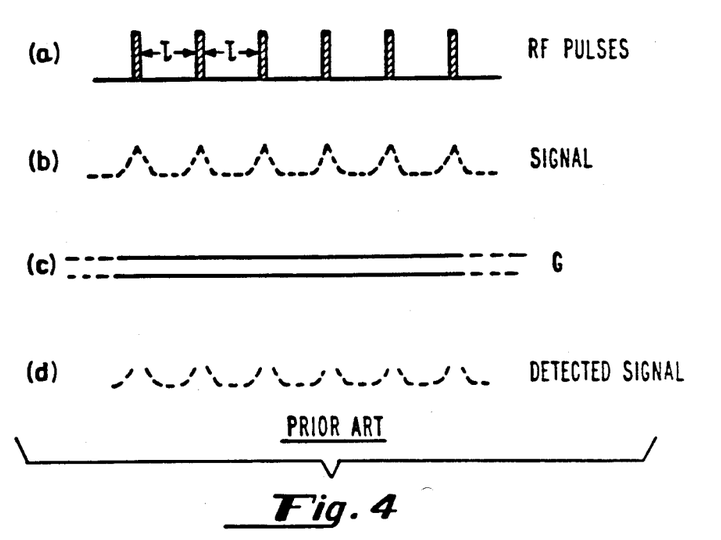
FIG. 4 shows an early known steady state free precession (SSFP) technique, and comprises.

What has been described thus far is the conventional steady state free precession technique, as described in the Moore et al. patent referred to above. FIG. 4 shows signals generated using one of these known techniques. FIG. 4(a) shows the sequence of application of the radio frequency pulses in time; FIG. 4(b) shows the resultant signal; FIG. 4(c) shows the gradient; and FIG. 4(d) shows the detected signal, illustrating the difficulty with prior SSFP techniques.

As shown in FIG. 4(a), the radio frequency pulses are relatively short in time, and are separated by a time spacing τ. FIG. 4(b) shows the signal which is generated. As is understood generally in NMR, the amplitude of this signal is indicative of the degree to which the nuclei are in phase, i.e., the degree to which their spins are aligned. At the time of application of the RF pulses, nuclei throughout the slice are aligned with one another in the driven equilibrium state. In the intervals τ between application of the pulses of radio frequency energy, the nuclei will naturally precess at varying frequencies according to their location with respect to the gradient. As they precess, the nuclei emit radiation which is detected by coil 10. At the time each RF pulse is applied, the nuclei are maximally in phase with one another, and the radiation is at a maximum value. Over time, the nuclei dephase. The signal drops off accordingly. The in-phase bulk transverse magnetization begins to increase as the spins rephase. See Hinshaw, J. App. Phys., 47: 3709 (1976). As shown in FIG. 4(b), the emitted signal, which again is proportional to the degree of transverse in-phase magnetization across the entire slice, thus shows peaks coincident with application of the RF pulses. This is the driven equilibrium state. The RF pulses ensure that nuclear magnetization is maintained at each τ; if the RF pulses were not applied, the signal would drop off relatively quickly, although the peaks would continue to occur.

FIG. 4(c) shows the gradient in the prior SSFP techniques. As shown, the gradient did not vary during a given experiment; naturally, the gradient was varied in order to generate a number of different projections in order to reconstruct an image with the standard projection reconstruction method. Finally, FIG. 4(d) shows the detected signal. This is the same as the signal shown in FIG. 4(b), the emitted signal, but the peaks are missing because the radio frequency energy applied (as shown in FIG. 4(a)) effectively prevents detection of the signal at those times, due to the much greater intensity of the applied radio frequency energy as compared to the detected signal, which is relatively weak, and of substantially the same bandwidth.

The fact that the peak signal could not be detected was a substantial limitation on prior art SSFP techniques; while expedients to remove this deficiency were tried, none were completely successful. As discussed above, to provide a signal detection technique which avoids this problem is an object of the invention, which is achieved as will now be discussed in connection with FIG. 5.

Figure 5:
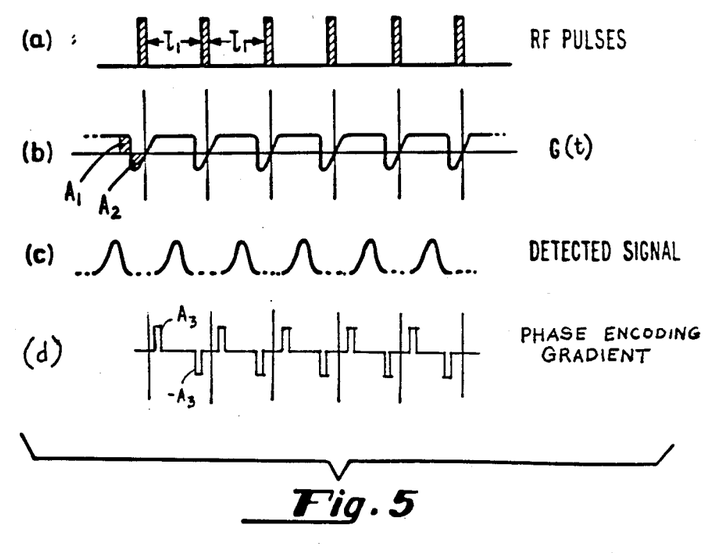
FIG. 5 is a timing diagram which shows the SSFP technique according to the preferred embodiment of the invention, and comprises.

As an example of present day SSFP imaging techniques for static nuclei, FIG. 5 illustrates the pulse sequence or timing diagram for the radio frequency pulses and magnetic field gradients. In SSFP, a stream of rf pulses is applied, separated by an interpulse interval τ as shown in FIG. 5(a). FIG. 5(b) shows the time variation of the read gradient which is varied synchronously with the rf pulses; and includes a negative lobe just prior to the application of each radio frequency pulse. The net gradient $G_{eff}$ is still positive, however, so as to provide the spatial periodicity discussed above. The steady-state magnetization obtained with an SSFP pulse sequence is not constant in time but periodic with a time period τ. The steady state is always characterized by the magnetic moments of the nuclei being maximally in phase at the time of the rf pulses. Additionally, the nuclear magnetization will rephase at any point in time where the net precession phase angle of the nuclei is zero relative to points in time where the SSFP magnetization is naturally in phase i.e., at the center of each rf pulse). The gradient reversal shown in FIG. 5(b) causes the dephasing due to the applied read gradient to be reversed such that the spins rephase during the interpulse interval, away in time from the interference of the rf transmitter. This gradient reversal has the effect of generating an additional peak in the detected signal earlier in the period defined by τ. The additional peak occurs between application of the radio frequency pulses of energy, as shown in FIG. 5(c). The peaks of the signal can now be readily detected.

Those skilled in the art will understand why application of a short period of negative gradient has the effect of creating an additional peak. At any given moment, the amplitude of the detected signal, shown in FIG. 5(c), is a measure of the net transverse nuclear magnetization, that is, the extent to which the nuclei are in phase with one another. After application of an RF pulse, whereupon the nuclei are in phase, the gradient causes them to precess at varying frequencies.

As understood by those skilled in the art, the relative phase of a nucleus is the time integral of its precession frequency; and is proportional to the time integral of the gradient evaluated over the appropriate time interval. It is well known from elementary calculus that the time integral of the gradient is proportional to the area under the plotted curve. Thus, referring to FIG. 5(b), when the negative area $A_2$ is equal to the positive area $A_1$, the time integral of the gradient G(t) from the time area $A_1$ begins to the time where $A_2$ ends is zero. The nuclei then have the same phase at these two points in time and since the nuclear magnetization is maximally in phase at the latter point in time, it will also be in phase at the first point in time. (Of course, this argument only applies to the phase produced by the applied gradient. Any other sources of phase production such as inhomogeneities in $H_o$ will not be compensated by the reversal of the read gradient.) FIG. 5(c) then shows the additional rephasing caused by this gradient reversal. This additional "gradient refocused spin echo" is the signal recorded for imaging. This spin-echo can be fully recorded without interference from the rf transmitter, which is not the case for the signal which refocuses at the center of each rf pulse.

FIG. 5(d) shows the waveform for the phase encoding gradient. As is usual in NMR imaging, the phase encoding gradient is applied a number of times (the actual number determines the resolution of the image in the direction of the phase encode gradient) and also as is usual, the amplitude of the phase encoding gradient is varied successively such that there is a uniform step in the gradient amplitude which is constant.

The phase encode gradient is applied in a direction perpendicular to the read gradient so that information in two dimensions can be obtained for the image. The particular feature of the phase encode gradient here (and which is described in more detail in the article by Hawkes & Patz, "Rapid Fourier Imaging Using SFPP," *Magnetic Resonance in Medicine*, Vol. 4, No. 1, pp. 9–23 (1987)) is that the total area under the phase encode gradient during the interpulse interval is zero. This is shown in FIG. 5(d) where a positive amplitude gradient pulse is applied immediately after an rf pulse. This gives the appropriate phase shift to the nuclear spins which is proportional to the area $A_3$. Then data is recorded, and afterwards and before the next rf pulse, a negative amplitude gradient pulse with area $-A_3$ is applied such that the total phase shift due to the phase encoding gradient during the interpulse interval $\tau$ is zero. This is important because it allows a steady-state to be established which is not influenced by the changing amplitude of the phase encode gradient during the imaging process. The reason for this is that the established steady state depends on the net precession angle during $\tau$. Thus, by always compensating the phase encode gradient such that the area under its waveform during $\tau$ is zero, the precession angle or phase shift it produces is zero.

The way in which slice selection is achieved is not described in detail here. The particular way the slice to be imaged is selected is known in the art. For example, one way is to use an oscillating gradient, see Hawkes and Patz, "Rapid Fourier Imaging Using SSFP," *Magnetic Resonance in Medicine*, Vol. 4, No. 1, pp. 9–23 (1987). Another standard slice selection technique utilizes selective RF pulses together with a gradient reversal of the slice selection gradient.

As described above in the discussion directed to FIG. 3, the magnetization of nuclei in the driven equilibrium state has a spatial wavelength $\lambda$, which is equal to the quantity $1/(G_{eff}*\gamma*\tau)$ from Equation 1. Because the effective gradient $G_{eff}$ and the time period $\tau$ are independently controllable, a desired wavelength lambda can be obtained according to the invention.

What has been described above is the embodiment of the invention which changes the magnetization spatial periodicity $\lambda$ between the formation of the two images by changing $\tau$. Another way of changing $\lambda$ is by changing the effective gradient $G_{eff}$. $G_{eff}$ is the DC gradient which, if applied, would contribute the same dephasing to a stationary nucleus as the switched (or time dependent) read gradient which is exemplified by the waveform in FIG. 5(b). A description of how to change the effective gradient $G_{eff}$ in order to control $\lambda$, and hence control the sensitivity to flow between the two images, is presented below.

It will be appreciated by those skilled in the art that the improvement in SSFP detection techniques as shown in FIG. 5 has application beyond the flow rate studies which are discussed here in detail, and that it will be generally applicable to a wide variety of SSFP imaging techniques. For example, the recent renaissance of SSFP techniques that are now being practiced and are available on commercial machines all use a gradient reversal of the read gradient to form a spin echo at a time different from when the rf pulses are applied.

Before embarking on a discussion of how to change $G_{eff}$ in order to control $\lambda$ (and hence flow sensitivity), we first define the term "effective gradient" to be that gradient which is constant as a function of time and which has the same effect on the precession of stationary nuclei as the applied gradient which is not constant in time. A steady state magnetization is achieved as long as the effective value of each applied gradient remains constant. For a single applied gradient, the spatial periodicity or wavelength $\lambda$ varies with both the effective gradient and with $\tau$. The magnetization of the nuclei oscillates in a periodic manner as a function of position in the applied gradient. The length over which one oscillation of magnetization occurs is the spatial periodicity or wavelength $\lambda$. The wavelength of the periodic magnetization can be adjusted such that the sensitivity of SSFP to flow is changed.

Of course, three orthogonal gradients are used in NMR imaging. There is a single vector effective gradient in this case whose direction determines the direction of oscillation of the magnetization and whose magnitude influences the value of $\lambda$. In practice, one usually arranges for the effective gradient to be zero for all gradients but one. In this way, the spatial periodicity lies along the direction of the single gradient that has a nonzero effective gradient. In the implementation described here, we have chosen the gradient known as the read gradient to be nonzero. The read gradient is always turned on during the time when the NMR signal is being recorded. Thus, the spatial projection of the object being studied (which is obtained by taking the Fourier transform of the recorded data) is in the direction of the read gradient.

The in-phase magnetization response at the Larmor frequency and at a time immediately after an rf pulse of angle $\theta$ is given by Hinshaw, supra:

$$M_{y,max} = \frac{(1-R_1)\sin\Theta}{1 + \cos\Theta(R_2 - R_1) - R_1R_2} \quad (2)$$

where $R_1 = \exp(-\tau/T_1)$ and $R_2 = \exp(-\tau/T_2)$. For $\theta = 90°$, this reduces to $$M_{y,max} = \frac{1 - R_1}{1 - R_1R_2} \quad (3)$$

We showed in "The Application of Steady State Free Precession to the Study of Very Slow Fluid Flow," *Mag. Res. Med.*, Vol. 3, pp. 140–45 (1986) that for blood (or other tissue) with $\tau << T_2, T_1$, Eq. 3 becomes $$M_{y,max} = \frac{T_2}{T_1 + T_2} \quad (4)$$

This of course makes the static signal insensitive to changes in $\tau$ and allowed the projection flow phantom subtraction experiments (as also described in "The Application of Steady State Free Precession to the Study of Very Slow Fluid Flow," *Mag. Res. Med.*, Vol. 3, pp. 140–45 (1986)) to be successful in blood or other tissues in which $\tau << T_1, T_2$. The condition $\tau << T_2, T_1$ however is not always satisfied with biological tissue. If the condition is not satisfied, then changing $\tau$ in order to vary $\lambda$ will not only change the sensitivity to flowing nuclei but will also change the sensitivity of stationary nuclei. The result is the subtraction of signals from stationary material will not result in a precise cancellation.

It is therefore desirable in many circumstances to change the effective gradient, rather than $\tau$, in order to change the magnetization spatial periodicity. By changing the effective gradient, a more precise cancellation of signals from stationary material is achieved upon subtraction.

Assume, then, that we keep $\tau$ fixed in the two experiments with different flow sensitivity and vary $G_{eff}$. To achieve good cancellation by subtraction of the background (static spins), three conditions must be satisfied by the pulse sequence:

Condition 1: The position of the spin-echo in the interpulse interval in each of the two experiments (image formations) must be identical. This is ncessary to keep the $T_2$ weighting of the signal the same. For example, the value of $M_{y,max}$ at a time $\tau_e$ after the last rf pulse is given by Eq. 1 multiplied by an additional factor $\exp(-\tau_e/T_2)$. Thus, $\tau_e$ must not change in the two experiments.

Condition 2: During the acquisition of the spin-echo, the read gradient must be the same in each experiment. This insures perfect registration of the two images for the subtraction. The digitization sampling rate determined by the dwell time, DW, is also kept constant so the spin-echo acquisition interval is the same.

Condition 3: Condition 3 relates to a constraint on the values $G_{eff}$ can have, which may be understood as follows. First we note the signal one observes from a particular voxel is proportional to $M_{obs}$ which is given by $$M_{obs} = \int M_y(r) dr, \quad (5)$$

and where the integration is over a distance equal to the linear dimension of the voxel along the read gradient, $l_R$. If $l_R = m*(\lambda)/2$, where m is an integer, then the image intensity in each pixel from a uniform sample will be uniform. If $l_R \neq m*(\lambda)/2$, there will be a modulation of intensity from voxel to voxel. Therefore we must restrict $G_{eff}$ to values such that there are an integral number of half wavelengths in each voxel length $l_R$. This is the third condition.

As an example, one strategy for meeting these conditions will be presented.

The frequency width per pixel $\Delta$ f(pixel), and the frequency width per spatial wavelength $\Delta$ f($\lambda$), are given by:

$$\Delta f(\text{pixel}) = \frac{1}{DW * N} \quad (6)$$

$$\Delta f(\lambda) = \gamma * G_R * \lambda \quad (7)$$

where N is the number of pixels in the read gradient direction (typically 256), DW is the dwell time for the digitization of a spin echo, and $G_R$ is the value of the read gradient while the spin-echo is being collected. Notice the usual Nyquist criteria of being able to measure frequencies up to one-half the sampling rate is doubled here because two data points (in phase and out of phase) are collected during each dwell time, DW. We introduce the quantity $\psi$:

$$\Delta f(\text{pixel}) = \frac{1}{(\psi * \tau)} \quad (8)$$

such that psi is the fraction of the interpulse interval reserved for the digitization of the spin-echo. Dividing Eq. 8 by Eq. 7 and substituting $1/(G_{eff} * \gamma * \tau)$ for $\lambda$, we have:

$$\frac{\Delta f(\text{pixel})}{\Delta f(\lambda)} = \frac{G_{eff}}{G_R} \cdot \frac{1}{\psi} \quad (9)$$

which according to Condition 3 becomes $$\frac{\Delta f(\text{pixel})}{\Delta f(\lambda)} = \frac{m}{2} = \frac{G_{eff}}{G_R} \cdot \frac{1}{\psi} \quad (10)$$

Figure 6:
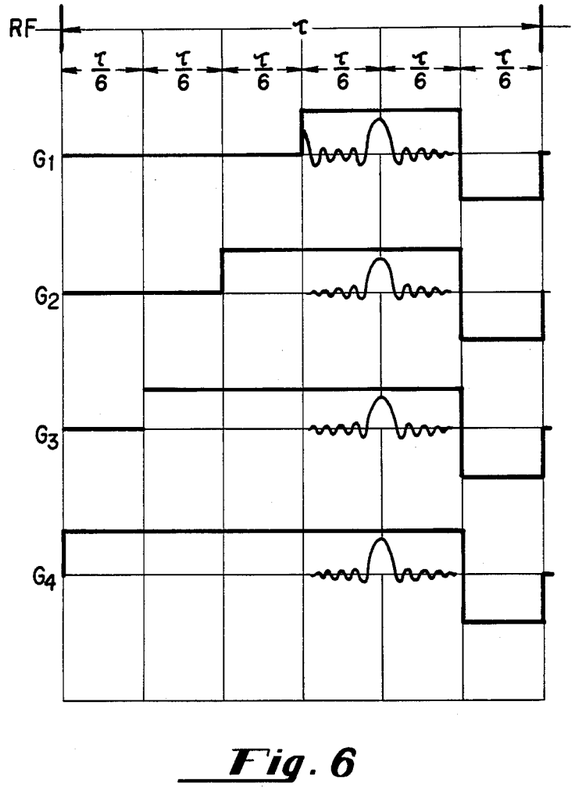
FIG. 6 shows exemplary timing diagrams of four read gradient waveforms which change the flow sensitivity of the SSFP signal but do not change the SSFP signal from stationary spins.

FIG. 6 shows an example of read gradient waveforms which satisfy Eq. 10 and which obey all three conditions. Here we have let $\psi = \frac{1}{3}$, so that $$\frac{G_{eff}}{G_R} = \frac{m}{6} \quad (11)$$

The waveforms $G_1$, $G_2$, $G_3$ and $G_4$ in FIG. 6 correspond to values of m equal to 1, 2, 3, and 4 respectively. Notice the $G_1$ waveform gives an asymmetric spin-echo; therefore we restrict ourselves to $G_2$, $G_3$ and $G_4$. The sort of strategy used in FIG. 6 where the interval $\tau$ is divided into six equal parts is applicable to other cases. Thus, FIG. 6 is understood to be exemplary, and not limiting.

In general, we can describe the strategy as follows. First we divide $\tau$ into k equal intervals. Condition 1, above, is satisfied because the spin-echo is always located in the k-2 and k-1 intervals (4th and 5th intervals for k=6). The number of different read gradient waveforms that fulfill Eq. 10 are k-2. However, one of these has an asymmetric spin-echo, leaving k-3 possible experiments with different flow sensitivity.

A comparison between the flow sensitivity obtained by varying the interpulse interval $\tau$ versus varying the spatial wavelength $\lambda$ can be made. The flow sensitivity can be described by a dimensionless parameter $\phi$ which we define as the distance $\Delta x$ a spin travels in the time $\tau$ as compared to $\lambda$. For the case of a spin moving at a constant speed v, we have:

$$\phi = \frac{\Delta x}{\lambda} = \frac{v * \tau}{\lambda} \quad (12)$$

Note that $\Delta x$ is the distance travelled in the time $\tau$ parallel to the direction of spatial periodicity which in our case is parallel to the direction of the read gradient. Substituting in for $\lambda$ the expression found in Equation 1, we have $$\phi = \gamma * G_{eff} * v * \tau^2 \quad (13)$$

We see therefore that if we change the flow sensitivity by doubling $\tau$, we change the value of $\phi$ by a factor of four. Hence, if one desired to obtain the same change in flow sensitivity by changing $G_{eff}$, one would have to increase its value by four. Equation 13 is an expression which allows one to determine the appropriate values of $G_{eff}$ and $\tau$ which would give the same sensitivity to slow flow (i.e. 1 mm/s flow rates) as were obtained in previous experiments (see Patz and Hawkes, "The Application of Steady-State Free Precession to the Study of Very Slow Fluid Flow," in *Magnetic Resonance in Medicine*, Vol. 3, pp. 140-145 (1986), cited above) where only $\tau$ was varied. The determination of the appropriate values of $G_{eff}$ an $\tau$ are obtained by using two expressions for $\phi$, one for each of the two experiments. The two expressions are then set equal to each other.

An image of capillary flow (or slow fluid flow) can thus be made by subtracting two images, each differently sensitized to slow flow, but having the same sensitivity to static protons. The different sensitivity to slow flow is achieved by varying the spatial wavelength $\lambda$, and can be accomplished by either (1) changing $\tau$ or (2) changing $G_{eff}$. The images can be made with standard techniques such as two or three dimensional Fourier transform methods.

Those skilled in the art will have no difficulty in implementing the invention give the above disclosure; apparatus capable of adaptation for performing the method of the invention is commercially available from a number of manufacturers.

It will be appreciated that there has been described a method for nuclear magnetic resonance imaging of a physical body using data relating only to nuclei which flow slowly, and that a method has further been described for improved SSFP nuclear magnetic resonance measurement techniques. While a preferred embodiment of the invention has thus been described, it will be appreciated by those skilled in the art that further modifications and improvements can be made thereto and therefore that the invention should not be limited by the above exemplary disclosure, but only by the following claims.

What is claimed is:

1. A method for providing an image of a sample, wherein individual elements of said image have intensities corresponding to the quantity of slowly flowing fluids contained in said sample, said method comprising the steps of:
   (a) generating a first image using an imaging technique wherein:
      a first magnetization spatial periodicity is established;
      a detected NMR signal from slowly flowing fluids is dependent on the value of said first magnetization spatial periodicity, and a detected NMR signal from stationary material is not substantially dependent on said first magnetization spatial periodicity; and
      fast flowing fluids to not substantially contribute to the intensities of first image elements;
   (b) adjusting a magnetization spatial periodicity control parameter comprising an interpulse interval;
   (c) generating a second image using an imaging technique wherein:
      a second magnetization spatial periodicity is established;
      a detected NMR signal from slowly flowing fluids is dependent on the value of said second magnetization spatial periodicity, and a detected NMR signal from stationary material is not substantially dependent on said second magnetization spatial periodicity; and
      fast flowing fluids do not substantially contribute to the intensities of second image elements; and
   (d) mathematically manipulating said first and second images to produce a third image the intensity of whose elements are determined substantially solely by the nuclear magnetic resonance of nuclei in slowly flowing fluids in said sample.

2. A method for providing an image of a sample, wherein individual elements of said image have intensities corresponding to the quantity of slowly flowing fluids contained in said sample, said method comprising the steps of:
   (a) generating a first image using an imaging technique wherein:
      a first magnetization spatial periodicity is established;
      a detected NMR signal from slowly flowing fluids is dependent on the value of said first magnetization spatial periodicity, and a detected NMR signal from stationary material is not substantially dependent on said first magnetization spatial periodicity; and
      fast flowing fluids do not substantially contribute to the intensities of first image elements;
   (b) adjusting a magnetization spatial periodicity control parameter comprising an effective gradient;
   (c) generating a second image using an imaging technique wherein:
      a second magnetization spatial periodicity is established;
      a detected NMR signal from slowly flowing fluids is dependent on the value of said second magnetization spatial periodicity, and a detected NMR signal from stationary material is not substantially dependent on said second magnetization spatial periodicity; and fast flowing fluids do not substantially contribute to the intensities of second image elements; and (d) mathematically manipulating said first and second images to produce a third image the intensity of whose elements are determined substantially solely by the nuclear magnetic resonance of nuclei in slowly flowing fluids in said sample.

3. A method for providing an image of a sample, wherein individual elements of said image have intensities corresponding to the quantity of slowly flowing fluids contained in said sample, said method comprising the steps of:

(a) generating a first image using an imaging technique wherein:

a first magnetization spatial periodicity is established;

a detected NMR signal from slowly flowing fluids is dependent on the value of said first magnetization spatial periodicity, and a detected NMR signal from stationary material is not substantially dependent on said first magnetization spatial periodicity; and fast flowing fluids to not substantially contribute to the intensities of first image elements;

(b) adjusting a magnetization spatial periodicity control parameter;

(c) generating a second image using an imaging technique wherein:

a second magnetization spatial periodicity is established;

a detected NMR signal from slowly flowing fluids is dependent on the value of said second magnetization spatial periodicity, and a detected NMR signal from stationary material is not substantially dependent on said second magnetization spatial periodicity; and fast flowing fluids do not substantially contribute to the intensities of second image elements; and (d) mathematically manipulating said first and second images to produce a third image the intensity of whose elements are determined substantially solely by the nuclear magnetic resonance of nuclei in slowly flowing fluids in said sample.

4. The method according to claim 3 wherein said image generation steps comprise:
using an SSFP imaging technique.

5. The method according to claim 4, wherein said step of using said SSFP imaging technique comprises:
applying a gradient of magnitude small enough to be produced by standard clinical NMR equipment.

6. The method according to claim 5, wherein said step of using said SSFP imaging technique comprises:
applying a gradient of a magnitude which does not exceed 1.0 Gauss/cm.

7. The method according to claim 5, wherein said step of using said SSFP imaging technique comprises:
applying a gradient of a magnitude which does not exceed 0.25 Gauss/cm.

8. The method according to claim 3, wherein said generating steps comprise:
applying a gradient of magnitude small enough to be produced by standard clinical NMR equipment.

9. The method according to claim 8, wherein said generating steps comprise:
applying a gradient of a magnitude which does not exceed 1.0 Gauss/cm.

10. The method according to claim 8, wherein said generating steps comprise:
applying a gradient of a magnitude which does not exceed 0.25 Gauss/cm.

11. The method according to claim 3, wherein said adjusting step comprises:
changing an interpulse interval of periodic radio frequency pulses which are used in said imaging technique.

12. The method of claim 11, further comprising:
reversing said gradient for a portion of each interpulse interval.

13. The method according to claim 3, wherein the nuclei in said slowly flowing fluid have a zero mean velocity.

14. The method according to claim 3, wherein the nuclei in said solely flowing fluid have a non-zero mean velocity.

15. The method according to claim 3, wherein
said sample comprises living biological tissue; and
said slowly flowing fluid comprises blood flowing through capillaries.

16. The method according to claim 3, wherein said step of mathematically manipulating comprises:
subtracting said second image from said first image to substantially eliminate contributions to the intensities of the third image's elements from stationary nuclei in said sample.

17. The method according to claim 3, wherein said adjusting step comprises:
changing an effective gradient.

18. The method according to claim 17, wherein said image generation steps comprise:
applying periodic radio frequency pulses to define interpulse intervals; and
maintaining positions of spin echoes in said interpulse intervals to be identical in said two image generation steps.

19. The method according to claim 17, wherein said image generation steps comprise:
maintaining a read gradient applied when acquiring information from spin echoes to be identical in each of said two image generation steps.

20. The method according to claim 17, wherein said image generation steps comprise:
restricting an effective gradient to values such that there are an integral number of half-wavelengths of spatially periodic magnetization along at least one voxel linear dimension.

21. The method according to claim 17, wherein said image generation steps comprise:
applying periodic radio frequency pulses to define interpulse intervals;
maintaining positions of spin echoes in said interpulse intervals to be identical in said two image generation steps;
maintaining a read gradient applied when acquiring information from spin echoes to be identical in each of said two image generation steps; and
restricting an effective gradient to values such that there are an integral number of half-wavelengths of spatially periodic magnetization along at least one voxel linear dimension.

22. An apparatus for providing an image of a sample, wherein individual elements of said image have intensities corresponding to the quantity of slowly flowing fluids contained within said sample, said apparatus comprising:

imaging means for generating images in which substantially no contribution is made to the image element intensities by fast flowing fluids;

means for adjusting a magnetization spatial periodicity control parameter comprising an interpulse interval, for allowing said imaging means to generate two images using an imaging technique wherein:

respectively different magnetization spatial periodicities are established during the generation of said two images;

a detected NMR signal from slowly flowing fluids is dependent on the value of said magnetization spatial periodicity; and a detected NMR signal from stationary material is not substantially dependent on the value of said magnetization spatial periodicity; and means for mathematically manipulating said two images to produce a third image whose image element intensities are determined substantially solely by the nuclear magnetic resonance of nuclei in slowly flowing fluids in said sample.

23. An apparatus for providing an image of a sample, wherein individual elements of said image have intensities corresponding to the quantity of slowly flowing fluids contained within said sample, said apparatus comprising:

imaging means for generating images in which substantially no contribution is made to the image element intensities by fast flowing fluids;

means for adjusting a magnetization spatial periodicity control parameter comprising an effective gradient, for allowing said imaging means to generate two images using an imaging technique wherein:

respectively different magnetization spatial periodicities are established during the generation of said two images;

a detected NMR signal from slowly flowing fluids is dependent on the values of said magnetization spatial periodicity; and a detected NMR signal from stationary material is not substantially dependent on the value of said magnetization spatial periodicity; and means for mathematically manipulating said two images to produce a thrd image whose image element intensities are determined substantially solely by the nuclear magnetic resonance of nuclei in slowly flowing fluids in said sample.

24. An apparatus for providing an image of a sample, wherein individual elements of said image have intensities corresponding to the quantity of slowly flowing fluids contained within said sample, said apparatus comprising:

imaging means for generating images in which substantially no contribution is made to the image element intensities by fast flowing fluids;

means for adjusting a magnetization spatial periodicity control parameter for allowing said imaging means to generate two images using an imaging technique wherein:

respectively different magnetization spatial periodicities are established during the generation of said two images;

a detected NMR signal from slowly flowing fluids is dependent on the value of said magnetization spatial periodicity; and a detected NMR signal from stationary material is not substantially dependent on the value of said magnetization spatial periodicity; and means for mathematically manipulating said two images to produce a third image whose image element intensities are determined substantially solely by the nuclear magnetic resonance of nuclei in slowly flowing fluids in said sample.

25. The apparatus according to claim 24, wherein said imaging means comprises:

SSFP imaging means.

26. The apparatus according to claim 25, wherein said SSFP imaging means comprises:

gradient generation means for applying a gradient of magnitude small enough to be produced by standard clinical NMR equipment.

27. The apparatus according to claim 26, wherein said SSFP imaging means comprises:

gradient generation means for applying a gradient of magnitude which does not exceed 1.0 Gauss/cm.

28. The apparatus according to claim 26, wherein said SSFP imaging means comprises:

gradient generation means for applying a gradient of magnitude which does not exceed 0.25 Gauss/cm.

29. The apparatus according to claim 24, wherein said imaging means comprises:

gradient generation means for applying a gradient of magnitude small enough to be produced by standard clinical NMR equipment.

30. The apparatus according to claim 29, wherein said imaging means comprises:

gradient generation means for applying a gradient of magnitude which does not exceed 1.0 Gauss/cm.

31. The apparatus accordin to claim 29, wherein said imaging means comprises:

gradient generation means for applying a gradient of magnitude which does not exceed 0.25 Gauss/cm.

32. The apparatus of claim 24, wherein said means for adjusting comprises:

means for changing an interpulse interval of periodic radio frequency pulses used in said imaging means.

33. The apparatus of claim 32 further comprising:

means for varying said gradient field during the interpulse intervals, whereby an additional peak of the detected signal is formed, displaced in time from said radio frequency pulses.

34. The apparatus according to claim 24, wherein the nuclei in said slowly flowing fluid have a zero mean velocity.

35. The apparatus according to claim 24, wherein the nuclei in said slowly flowing fluid have a non-zero mean velocity.

36. The apparatus according to claim 24, wherein:

said sample comprises living biological tissue; and said slowly flowing fluid comprises blood flowing through capillaries.

37. The apparatus according to claim 24, wherein said means for mathematically manipulating comprises:

means for subtracting images for substantially eliminating contributions to the intensities of the third image's elements from stationary nuclei in said sample.

38. The apparatus of claim 24, wherein said means for adjusting comprises:

means for changing an effective gradient in said imaging means.

39. The apparatus according to claim 38, wherein said imaging means comprises:

means for applying periodic radio frequency pulses to define interpulse intervals; and means for positioning spin echoes in said interpulse intervals identically in the generation of said two images.

40. The apparatus according to claim 38, wherein said imaging means comprises:

gradient means for maintaining a read gradient applied when acquiring information from spin echoes to be identical in said generation of said two images.

41. The apparatus according to claim 38, wherein said imaging means comprises:

gradient means for restricting an effective gradient to values such that there are an integral number of half-wavelengths of spatially periodic magnetization along at least one voxel linear dimension.

42. The apparatus according to claim 38, wherein said imaging comprises comprises:

means for applying periodic radio frequency pulses to define interpulse intervals;

-means for positioning spin echoes in said interpulse intervals identically in the generation of said two images;

gradient means for maintaining a read gradient applied when acquiring information from spin echoes to be identical in said generation of said two images, an for restricting an effective gradient to values such that there are an integral number of spatially periodic magnetization half-wavelengths along at least one voxel linear dimension.

* * * * *